United States Patent
Agarwal et al.

(10) Patent No.: US 9,343,949 B2
(45) Date of Patent: May 17, 2016

(54) CONTROL CIRCUIT TO DETECT A NOISE SIGNAL DURING A STATE CHANGE OF A SWITCH

(71) Applicant: TEXAS INSTRUMENTS INCORPORATED, Dallas, TX (US)

(72) Inventors: Nitin Agarwal, Bangalore (IN); Sachin Sudhir Turkewadikar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/492,569

(22) Filed: Sep. 22, 2014

(65) Prior Publication Data

US 2016/0087518 A1    Mar. 24, 2016

(51) Int. Cl.
G05F 1/565 (2006.01)
H02M 1/00 (2006.01)
H02M 3/158 (2006.01)

(52) U.S. Cl.
CPC ............... *H02M 1/00* (2013.01); *H02M 3/158* (2013.01); *H02M 2001/0003* (2013.01)

(58) Field of Classification Search
CPC .......................................................... G05F 3/16
USPC ......................................... 323/271, 280–289
See application file for complete search history.

(56) References Cited

U.S. PATENT DOCUMENTS

| | | | | |
|---|---|---|---|---|
| 6,137,280 A | * | 10/2000 | Ackermann | H02J 7/0008 323/224 |
| 7,928,119 B2 | * | 4/2011 | Shimojo | A61K 31/00 514/303 |
| 7,928,712 B1 | * | 4/2011 | Levesque | H02M 3/156 323/222 |
| 8,716,989 B2 | * | 5/2014 | de Cremoux | H02M 3/1582 323/271 |
| 2012/0105039 A1 | * | 5/2012 | Brown | H02M 1/38 323/283 |
| 2014/0266113 A1 | * | 9/2014 | Zuniga | H02M 1/088 323/282 |
| 2015/0091539 A1 | * | 4/2015 | Norling | H02M 3/158 323/271 |

* cited by examiner

*Primary Examiner* — Adolf Berhane
*Assistant Examiner* — Nusrat Quddus
(74) *Attorney, Agent, or Firm* — John R. Pessetto; Frank D. Cimino

(57) ABSTRACT

Several circuits and methods for driver control of a switching circuit are disclosed. In an embodiment, a circuit for driver control of a switching circuit includes a driver circuit and a control circuit. The driver circuit is capable of being coupled to the switching circuit. The switching circuit includes a first switch and a second switch. The driver circuit is configured to control a conductive state of the switching circuit by facilitating an alternate state change of the first switch and the second switch. The control circuit is coupled to the driver circuit and is configured to detect a noise signal during a state change of the first switch. The control circuit is further configured to control the driver circuit to thereby slow down the state change of the first switch.

12 Claims, 4 Drawing Sheets

CONTROL CIRCUIT TO DETECT A NOISE SIGNAL DURING A STATE CHANGE OF A SWITCH

TECHNICAL FIELD

The present disclosure generally relates to the field of driver control of switching circuit.

BACKGROUND

Electrical loads in various power management applications are driven by switching circuits. Examples of the power management applications can include, but are not limited to, direct current to direct current (DC-DC) converters and Class D amplifiers. A switching circuit employs semiconductor switches with high switching frequencies that are driven by a driver circuit.

During the operation of the driver circuit, a switching noise (which can be caused, for example, by package inductances or by printed circuit board inductances) can be induced, thereby causing phenomenon such as supply bounce and ground bounce in an operating voltage of the switching circuit. Such noise-induced phenomenon can further lead to breakdown of the switches. The supply bounce and the ground bounce can be caused in higher proportions for low cost packages, such as, for example, a thin quad flat package and a small quad flat package. Furthermore, in addition to the undesirable phenomenon of supply bounce and the ground bounce, the switching noise can also create reliability and performance issues for the switching circuit, the driver circuit and other circuits sharing a common power supply. The switching noise can couple onto circuits present on-chip through a substrate and also couple onto the other circuits present on-board sharing the power supply with the switching circuit. Furthermore, in addition, the switching noise can also cause a higher level of electromagnetic interference (EMI) thus violating emission specification associated with the switching circuit.

In addition to the foregoing, in certain scenarios the switching noise, and in turn the supply bounce and ground bounce, can be reduced if the driver circuit is operated at a low speed. However, operation of the driver circuit at low speeds can cause degradation in efficiency of the switching circuit due to an increase in switching loss. Moreover, the switching noise, as well as the reliability and performance issues in the switching circuit, can also be reduced if high voltage devices are used to reduce the supply bounce and ground bounce. However, such high voltage devices can increase manufacturing and product costs due to mask addition, while the switching noise is still associated with the circuits sharing the common power supply.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

Various circuits and methods for driver control of a switching circuit are disclosed. A circuit for driver control of a switching circuit includes a driver circuit and a control circuit. The driver circuit is capable of being coupled to the switching circuit that includes a first switch and a second switch. The driver circuit is configured to control a conductive state of the switching circuit by facilitating an alternate state change of the first switch and the second switch. The control circuit is coupled to the driver circuit and is configured to enable detection of a noise signal during a state change of the first switch. The control circuit is further configured to control the driver circuit to thereby slow down the state change of the first switch.

In an embodiment, a regulating circuit including a switching circuit, a driver circuit, and a control circuit is disclosed. The switching circuit includes a first switch and a second switch, where the first switch and the second switch are configured to undergo an alternate state change to thereby provide power to a load during a conductive state of the switching circuit. The driver circuit is coupled to the switching circuit and includes a first driver circuit and a second driver circuit. The driver circuit is configured to control a conductive state of the switching circuit by facilitating the alternate state change of the first switch and the second switch. The control circuit is coupled to the driver circuit and is configured to enable detection of a noise signal during a state change of the first switch. The control circuit is further configured to control the driver circuit to thereby slow down the state change of the first switch.

Additionally, in an embodiment, a method of driver control of a switching circuit is disclosed. The method includes enabling the switching circuit comprising a first switch and a second switch, the first switch and the second switch configured to undergo an alternate state change between a conducting state and a non-conducting state thereof, to thereby provide power to a load during a conductive state of the switching circuit. The method also includes enabling a detection of a noise signal during a state change of the first switch. The method further includes facilitating reduction of a current input to the first switch to thereby slow down the state change of the first switch.

Other aspects and example embodiments are provided in the drawings and the detailed description that follows.

The drawings referred to in this description are not to be understood as being drawn to scale except if specifically noted, and such drawings are provided for example purposes only.

DETAILED DESCRIPTION

Switching circuits are widely used in power management applications that require high supply efficiency. Examples of the power management applications can include battery-powered and handheld devices that employ switching circuits for an efficient battery life. In another example, the switching circuits are used in switching power supply converters, for example in a direct current-direct current (DC-DC) converter. In one example, non-battery powered devices also employ the DC-DC converter including the switching circuit for lower power dissipation. A switching power supply converter includes a switching circuit (including a first switch and a second switch) and a driver circuit that are collectively configured to drive a load. In another example, the switching circuits are used in switching amplifiers, for example in a Class D amplifier. In a DC-DC converter, the switching circuit enables generation of a constant and stable DC voltage as output. In a Class D amplifier, the switching circuit modulates switching voltage or output current.

In various embodiments, the switching circuit can include a pair of switches that can alternately undergo state change for modulating the switching voltage or output current. In other embodiments, the pair of switches can include a single switch and a diode that can undergo state change for modulating the switching voltage or output current. In an example embodiment, the alternate state change of the switching circuit is facilitated by the driver circuit coupled to the switching circuit. In various embodiments, the driver circuit configured to drive the switching circuit can be controlled by a control circuit. An example switching circuit being driven by a driver circuit in a switching power supply system is explained with reference to FIG. 1. It will be noted that the technique for controlling the switching circuit can be implemented in various applications, such as an asynchronous converter, a DC-DC converter, and so on. An example DC-DC converter implementation embodying the disclosed technique for control of switching circuit is further explained with reference to FIG. 3.

Figure 1:
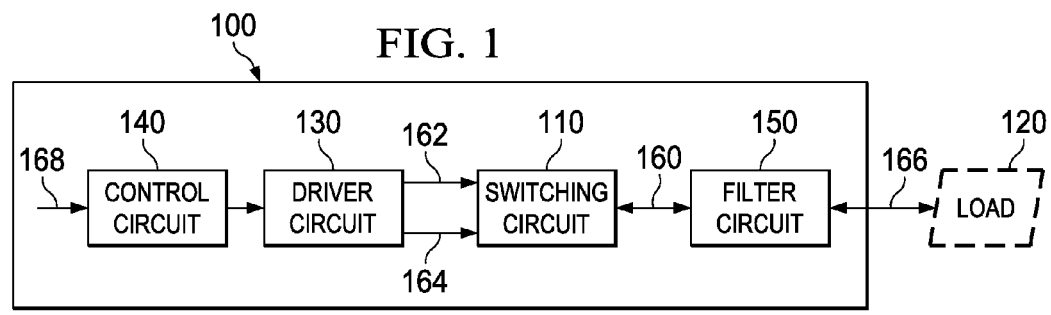
FIG. 1 is a block diagram of a circuit for driver control of a switching circuit in accordance with an example scenario.

FIG. 1 is a block diagram of a block 100 for a circuit for driver control of a switching circuit, for example a switching circuit 110, in accordance with an example scenario. In an example embodiment, the block 100 can be embodied in a switching power supply system illustrated in FIG. 1. In an example embodiment, the switching power supply system includes a regulating circuit 100 (represented by the block 100 in FIG. 1) for regulating a power supply to a load, for example a load 120. In an embodiment, the circuit for driver control of the switching circuit 110 can be used for regulating an output voltage of an electronic device in a plurality of applications. Examples of the electronic device include, but are not limited to, a switched-mode power supply (SMPS), a DC-DC converter, and the like.

In an embodiment, the regulating circuit 100 includes the switching circuit 110, a driver circuit 130 and a control circuit 140. The driver circuit 130 is coupled to the switching circuit 110, and is configured to drive the switching circuit 110 so as to provide a switching voltage (represented as a signal 160) as an output of the switching circuit 110. In an embodiment, the control circuit 140 is coupled to the driver circuit 130 and is configured to control output of the driver circuit 130 (represented as a signal 162 and a signal 164), which can further facilitate in regulating the output voltage (represented as a signal 166) of the electronic device employing the switching circuit 110.

In an example embodiment, the switching circuit 110 includes a pair of switches, for example, a first switch and a second switch. In an example embodiment, the first switch and the second switch are configured to alternately change state thereof so as to provide current to the load 120 coupled to the switching circuit 110. For example, the first switch and the second switch can undergo an alternate state change to thereby provide a constant current to the load 120. In an embodiment, the alternate state change of the first switch and the second switch can be referred to as 'transition of operation' of the first switch or the second switch. In certain embodiments, the state change of the first switch and the second switch can be referred to as turning-on/turning-off or transition of operation of the first switch and the second switch. It will be noted that such terms as state change, transition of operation, turning-on/turning-off, logic high/low, and any other alike terms will refer to a turning-on or turning-off of a switch, and shall not be construed as limiting. Herein, 'the transition of operation of the first switch or the second switch' refers to a state change of the first switch or a state change of the second switch (for example, the first switch or the second switch changes state from a conducting state to a non-conducting state).

In an example embodiment, the driver circuit 130 is capable of being coupled to the switching circuit 110 for driving an operation of the switching circuit 110. For example, the driver circuit 130 is configured to control a conductive state of the switching circuit 110 by facilitating alternate state change of the first switch and the second switch of the switching circuit 110.

In an example embodiment, during a state change of the first switch, a noise signal 168 is generated during the state change. In an example embodiment, the noise signal 168 is generated due to occurrence of undesirable conditions/phenomenon such as supply bounce and the ground bounce in a circuit embodying the switching circuit, for example the switching circuit 110. In an example scenario, the conditions such as the supply bounce and the ground bounce can occur due to the switching noise (also referred to as di/dt noise) caused by the presence of parasitic inductances in the circuit. For example, in various scenarios, the supply bounce and the ground bounce refers to the switching noise on the power supply and ground lines of the regulating circuit 100, which includes a resistive drop in a chip due to on-chip bond wires and trace resistances, inductive noise due to chip-package interface inductance including bond wire self-inductance, trace self-inductance, trace-to-trace mutual inductance, and capacitive coupling due to chip-package interface cross-coupling capacitances. As a result of the 'supply bounce' and 'ground bounce' phenomenon, during the state change, values of effective voltage being applied at the regulating circuit 100 are increased as compared to the voltage being supplied by an external voltage source.

In an example embodiment, the control circuit 140 is coupled to the driver circuit 130, and is configured to control an operation of the driver circuit 130. For example, the control circuit 140 is configured to detect occurrence of the conditions such as the supply bounce and the ground bounce in an operating voltage of the regulating circuit 100 and/or during the alternate state change of the first switch in the switching circuit 110. In an example embodiment, the control circuit 140 is configured to detect the occurrence of the conditions such as the supply bounce and the ground bounce by detecting the noise signal 168 generated during the state change of the first switch. In an example embodiment, the control circuit 140 is configured to reduce current input to the first switch on the detection of the noise signal 168. In an example embodiment, reducing the current input to the first switch facilitates in slowing down the state change of the first switch, thereby facilitating in reducing the occurrence of the conditions such as the supply bounce and the ground bounce.

In some embodiments, the regulating circuit (represented by the block 100) can include a filter circuit 150 coupled to the switching circuit 110. The filter circuit 150 can be configured to reduce and/or eliminate ripples from the switching voltage of the switching circuit 110. Herein, the 'filter circuit 150' is a circuit that can allow direct current (DC) components of the output signal from the switching circuit 110 to pass to the load 120, but blocks alternating current (AC) components of the output signal. An example of the filter circuit 150 is described further in detail with reference to FIG. 2. Also, various embodiments detailing the implementations of various components of the regulating circuit 100 are described further with reference to FIG. 2.

Figure 2:
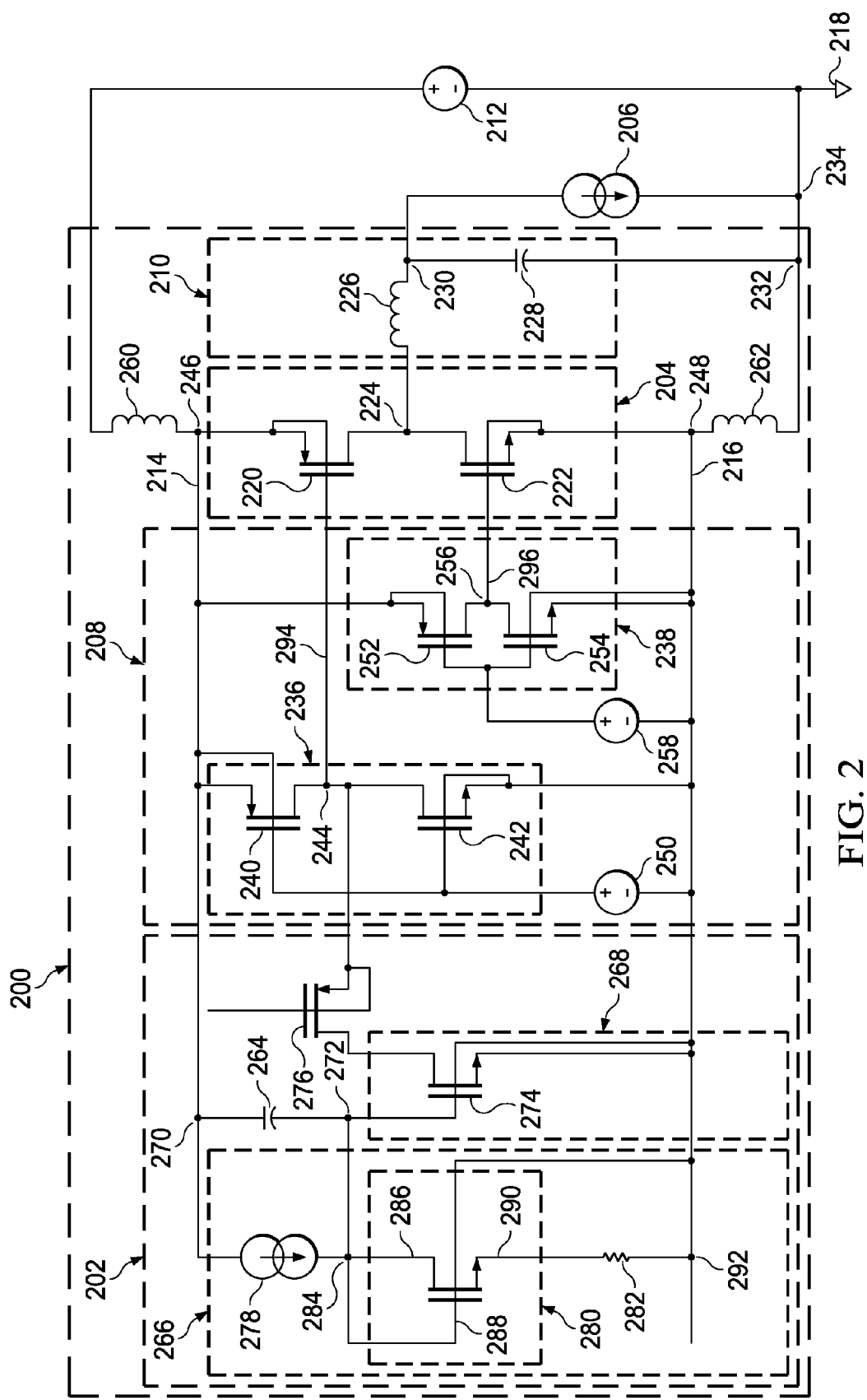
FIG. 2 is a circuit diagram of a regulating circuit including a control circuit configured for driver control of a switching circuit in accordance with an embodiment.

FIG. 2 is a circuit diagram of a regulating circuit 200 including a control circuit 202 configured for driver control of a switching circuit, in accordance with an embodiment. In an example embodiment, the control circuit 202 can be used in a plurality of applications and/or devices that employ the switching circuit and are configured to supply regulated power to a load. For example, the control circuit 202 can be embodied in a switching mode power supply converter. An implementation of the control circuit 202 for driver control of a switching circuit, for example a switching circuit 204, is described by utilizing the control circuit 202 coupled across a load, for example, a load 206. The control circuit 202 can be embodied in a variety of circuits/devices such as a DC-DC converter, and a Class D amplifier.

In an embodiment, the regulating circuit 200 includes the switching circuit 204, a driver circuit 208, and the control circuit 202 for driver control of the switching circuit 204. In an example embodiment, the regulating circuit 200 can include a filter circuit, for example a filter circuit 210, coupled to the switching circuit 204. In an embodiment, the regulating circuit 200 is coupled to an external voltage source 212. For example, the regulating circuit 200 (including the switching circuit 204, the driver circuit 208, and the control circuit 202) is coupled between a positive rail 214 and a negative rail 216 of the external voltage source 212. In an example embodiment, the negative rail 216 of the external voltage source 212 is coupled to a ground terminal, for example, a ground terminal 218.

In an example embodiment, the switching circuit 204 is an example of the switching circuit 110 (refer, FIG. 1). In an embodiment, the switching circuit 204 includes a first switch 220 and a second switch 222. In an example embodiment, the first switch 220 and the second switch 222 are configured to alternately facilitate state change based on a supply voltage to thereby support a provision of power to the load 206 during a conductive state of the switching circuit 204. The alternate state change of the first switch 220 and the second switch 222 facilitates in maintaining the output of the switching circuit 204. The state change of the first switch 220 includes switching the first switch 220 between a conducting state and a non-conducting state. The state change of the second switch 222 includes switching the second switch 222 between a conducting state and a non-conducting state. Herein, 'the conducting state of the first switch 220 or the second switch 222' refers to an example when an electric current is directed to make a circuit. Herein, 'the non-conducting state of the first switch 220 or the second switch 222' refers to an example when an electric current is directed to break a circuit.

In an example embodiment, the first switch 220 and the second switch 222 are power metal oxide semiconductor field effect transistors (MOSFETs). In an embodiment, the first switch 220 is a p-type metal oxide semiconductor (PMOS) transistor and the second switch 222 is an n-type metal oxide semiconductor (NMOS) transistor. The first switch 220 is also referred to as a control transistor or a high side power transistor and the second switch 222 is also referred to as a synchronous transistor or a low side power transistor. In some embodiments, the second switch 222 is a diode.

The external voltage source 212 is configured to provide an external supply voltage for the operation of the switching circuit 204. In an embodiment, a source terminal of the first switch 220 is coupled to a positive rail 214 of the external voltage source 212 at a node 246, and a source terminal of the second switch 222 is coupled to a negative rail 216 of the external voltage source 212 at a node 248. Additionally, a drain terminal of the first switch 220 is coupled to a drain terminal of the second switch 222 at a node 224. The switching circuit 204 is coupled to the load 206 through the filter circuit 210. In an example embodiment, the filter circuit 210 includes an output inductor 226 and an output capacitor 228. The output inductor 226 includes a first terminal coupled to the load 206 and to a first terminal of the output capacitor 228, at a node 230. The output capacitor 228 is coupled in parallel to the load 206 and has a second terminal coupled to the ground terminal 218 at a node 232. The load 206 is further coupled to the ground terminal 218 at a node 234.

Due to inherent switching in the switching circuit 204, noise (for example, the switching noise) gets manifested on the switching voltage of the switching circuit 204. In an embodiment, the filter circuit 210 is used to filter out the noise on the switching voltage of the switching circuit 204 and generate the output voltage. The filter circuit 210 is an example of a low pass LC filter that is based on the output inductor 226 and the output capacitor 228. In another example, the filter circuit 210 can be based on an output filter capacitor or a low pass RC filter.

In an embodiment, the switching circuit 204 is configured to be coupled to the driver circuit 208. In an embodiment, the driver circuit 208 includes a first driver circuit 236 (for example, a p-driver) and a second driver circuit 238 (for example, an n-driver). In an embodiment, the first driver circuit 236 and the second driver circuit 238 are configured to be coupled to the first switch 220 and the second switch 222, respectively, to alternately drive an alternate state change of the first switch 220 and the second switch 222, respectively, to thereby control the conductive state. For example, the first driver circuit 236 can be coupled to a gate terminal of the first switch 220 and the second driver circuit 238 can be coupled to a gate terminal of the second switch 222 for driving the first switch 220 and the second switch 222, respectively.

In an example embodiment, the first driver circuit 236 is a complementary metal oxide semiconductor (CMOS) circuit that includes a first transistor 240 coupled to a second transistor 242. For example, a drain terminal of the first transistor 240 is coupled to a drain terminal of the second transistor 242 at a node 244. In an embodiment, a source terminal of the first transistor 240 is coupled to the positive rail 214 of the external voltage source 212 at the node 246. Additionally, the gate terminal of the first switch 220 is coupled to the first driver circuit 236 at the node 244. A source terminal of the second transistor 242 is coupled to the negative rail 216 of the external voltage source 212 at node 248. Additionally, gate terminals of the first transistor 240 and the second transistor 242 are coupled to receive an input voltage of the first driver circuit 236 from a first driver voltage source 250. In an embodiment, the first transistor 240 includes a PMOS transistor and the second transistor 242 includes an NMOS transistor.

In an example embodiment, the second driver circuit 238 is a CMOS circuit that includes a third transistor 252 coupled to a fourth transistor 254. For example, a drain terminal of the third transistor 252 is coupled to a drain terminal of the fourth transistor 254 at a node 256. In an embodiment, a source terminal of the third transistor 252 is coupled to the positive rail 214 of the external voltage source 212 at the node 246. Additionally, the gate terminal of the second switch 222 is coupled to the second driver circuit 238 at the node 256. Additionally, the gate terminals of the third transistor 252 and the fourth transistor 254 are coupled to receive an input voltage of the second driver circuit 238 from a second driver voltage source 258. In an embodiment, the third transistor 252 includes a PMOS transistor and the fourth transistor 254 includes an NMOS transistor.

As previously discussed, the regulating circuit 200 is coupled to the external voltage source 212 so as to operate on the external supply voltage $V_{DD}$, $V_{SS}$ ($V_{DD}$ being a positive supply voltage and $V_{SS}$ being a negative supply voltage, respectively) supplied by the external voltage source 212. In some scenarios, the regulating circuit 200 can include parasitic inductances that can result in generation of switching noise in the regulating circuit 200 during the operation of the switching circuit 204. It will be noted that the parasitic inductance is present in package pins, bounding wires, socket, printed circuit board trace, via inductances, and on-chip integrated circuit (IC) interconnects of the chip embodying, at least partially, the regulating circuit 200.

In an example embodiment, the effect of parasitic inductance in the regulating circuit 200 is illustrated by inclusion of inductance elements between the terminals of the external voltage source 212 and the switching circuit 204. For example, as illustrated in FIG. 2, a first inductor element 260 between the positive rail 214 of the external voltage source 212 and the first switch 220, and a second inductor element 262 between the negative rail 216 of the external voltage source 212 and the second switch 222 are representative of the presence of parasitic inductance in the regulating circuit 200. In an example embodiment, due to the presence of parasitic inductance in the regulating circuit 200, the external supply voltage available at the regulating circuit 200 is reduced or increased (based on a ringing phenomenon of the external supply voltage, the ringing phenomenon or a ripple associated with a signal can be defined as an unwanted oscillation of the signal). For example, the external supply voltage available at the regulating circuit 200 is reduced or increased to an internal supply voltage including an internal positive supply voltage ($V_{DD\_INT}$) (the positive rail 214 of the external voltage source 212) and an internal negative supply voltage ($V_{SS\_INT}$) (the negative rail 216 of the external voltage source 212).

In an embodiment, the switching circuit 204, the driver circuit 208, and the control circuit 202 of the regulating circuit 200 operate at supply voltages $V_{DD\_INT}$ generated at the node 246, and $V_{SS\_INT}$ generated at the node 248. The output inductor 226 is connected to and disconnected from $V_{DD\_INT}$ by the switching circuit 204 to regulate an output voltage. The output inductor 226 further receives a switching voltage from the switching circuit 204 to generate and provide the output voltage to the load 206 through the output capacitor 228. The driver circuit 208 is configured to drive the switching circuit 204 to provide the switching voltage.

It will be noted that on occurrence of a time-domain current variation across an inductor element, a voltage fluctuation is generated across the inductor element. For example, during alternate switching of operation between the first switch 220 and the second switch 222, when the first switch 220 and the second switch 222 undergo state change alternately, voltage fluctuations at power distribution lines (for example, the positive rail 214 and the negative rail 216) of the regulating circuit 200 occur. In some embodiments, the voltage fluctuations are proportional to the inductance (for example, the parasitic inductance) of the chip-package interface and the rate of change of the current (di/dt), and thus can be termed as parasitic noise.

In an example embodiment, for a state change of the first switch 220 and the second switch 222 of the switching circuit 204, the first driver circuit 236 and the second driver circuit 238 can operate (or drive respective switches) at high speeds to enable fast switching between the first switch 220 and the second switch 222. In such scenarios, the fast switching operation between the first switch 220 and the second switch 222 can lead to increase in the parasitic noise in the regulating circuit 200. The increase of the parasitic noise further leads to conditions known as supply bounce and ground bounce in the regulating circuit 200. As already discussed, the supply bounce and the ground bounce refers to switching noise on the power supply and ground lines of the regulating circuit 200, which includes a resistive drop due to bond wire and trace resistances, inductive noise due to chip-package interface inductance including bond wire self-inductance, trace self-inductance, trace-to-trace mutual inductance, and capacitive coupling due to chip-package interface cross-coupling capacitances. As a result of the 'supply bounce' and 'ground bounce' phenomenon, the values of $V_{DD\_INT}$ and $V_{SS\_INT}$ are increased or decreased as compared to $V_{DD}$ and $V_{SS}$, respectively.

Hereinafter, for ease of understanding and brevity of description, the phenomenon of supply bounce and ground bounce can be assumed to be indicated by generation of a signal hereinafter referred to as a 'noise signal'. In various embodiments, techniques have been provided for reducing/eliminating the supply bounce and ground bounce phenomenon in the regulating circuit 200. For example, a control circuit 202 can be embodied in the regulating circuit 200 that is configured to enable detection of the noise signal during the state change of the first switch 220. The control circuit 202 is further configured to control the driver circuit 208 to thereby slow the turning-off of the first switch 220 during the state change. In an embodiment, the slowing down of the state change of the first switch 220 can facilitate in reducing the supply and/or ground bounce or the noise signal. In an example embodiment, the control circuit 202 is an example of the control circuit 140 (refer, FIG. 1).

In an embodiment, the control circuit 202 is coupled to the driver circuit 208. The control circuit 202 includes a coupling capacitor 264, a bias circuit 266, and a pull-down circuit 268. The coupling capacitor 264 is configured between a node 270 and a bias node 272, hereinafter referred to as the node 272, such that at the node 270, the coupling capacitor 264 is coupled to the positive rail 214 of the external voltage source 260, and at the node 272, the coupling capacitor 264 is coupled to the bias circuit 266 and the pull-down circuit 268.

In an embodiment, the pull-down circuit 268 is coupled to the coupling capacitor 264 and the bias circuit 266 at the node 272. In an embodiment, the pull-down circuit 268 includes an NMOS transistor 274. The NMOS transistor 274 of the pull-down circuit 268 includes a gate terminal coupled to the coupling capacitor 264 at the node 272, a source terminal coupled to the negative rail 216 of the voltage at the node 248, and a drain terminal coupled to the first driver circuit 236.

In some embodiments, instead of directly connecting the pull-down circuit 268 with the first driver circuit 236, the pull-down circuit 268 can be coupled to the first driver circuit 236 through a current limiting switch, for example a current limiting switch 276. In an embodiment, the current limiting switch 276 is coupled between the pull-down circuit 268 with the first driver circuit 236 such that the current limiting switch 276 is enabled during a conducting state of the first switch 220 and disabled during a non-conducting state of the first switch 220. Herein, 'the current limiting switch 276 is enabled' refers to switching a state of the current limiting switch 276 to a conducting state. Herein, 'the current limiting switch 276 is disabled' refers to switching a state of the current limiting switch 276 to a non-conducting state.

In an embodiment, the current limiting switch 276 is configured to disable a path (between the first transistor 240 and the NMOS transistor 274 of the pull-down circuit 268) after the first switch 220 is completely turned-off. The current limiting switch 276 is hence configured to facilitate in preventing a shoot-through current to flow from the first transistor 240 to the NMOS transistor 274 of the pull-down circuit 268 when the first switch 220 is turned-off. In an embodiment, the current limiting switch 276 can be a PMOS transistor. In an embodiment, the PMOS transistor of the current limiting switch 276 includes a source terminal coupled to the first transistor 240 of the first driver circuit 236 at the node 244, a gate terminal of the current limiting switch 276 is coupled to the second driver circuit 238 at the node 256, and a drain terminal of the current limiting switch 276 is coupled to the drain terminal of the NMOS transistor 274 of the pull-down circuit 268. The operation of the current limiting switch 276 is described further in the description below.

Herein, the configuration of the control circuit 202 is explained by assuming the control circuit 202 to include the coupling capacitor 264, the bias circuit 266, and the pull-down circuit 268. It will be noted that in other embodiments, the configuration of the control circuit 202 can vary to include more or fewer and/or different components than as described above. In general, the control circuit 202 can include components that can collectively be capable of controlling a current input to the driver circuit(s) (236 or 238) associated with the switching circuit 204, so as to slow down the state change (for example, from a conducting state to a non-conducting state or from a non-conducting state to a conducting state) of respective switches of the switching circuit 204.

In an example embodiment, the bias circuit 266 is configured to be coupled between the positive rail 214 and the negative rail 216 of the external voltage source 212. The bias circuit 266 includes a current source 278, a bias transistor 280, and a resistive element 282. In an embodiment, the current source 278 of the bias circuit 266 is coupled across the coupling capacitor 264 between the nodes 270 and 272, where a node 284 is coupled to the node 272. The current source 278 is further coupled to the bias transistor 280. As illustrated in FIG. 2, current source 278 is coupled to a drain terminal 286 of the bias transistor 280 at the node 284. A gate terminal 288 of the bias transistor 280 is coupled to the drain terminal 286 of the bias transistor 280. The bias transistor 280 is further coupled to a first terminal of the resistive element 282. Particularly, the first terminal of the resistive element 282 is coupled to a source terminal 290 of the bias transistor 280 and a second terminal of the resistive element 282 is coupled to the negative rail 216 of the external voltage source 212 at a node 292. The drain terminal 286 of the bias transistor 280 is further coupled to the current source 278 at the node 284.

The operation of the regulating circuit 200 for facilitating of the driver control of the switching circuit 204 is described in detail below. Herein, the configuration of the bias circuit 266 is explained by assuming the bias circuit 266 to include the current source 278, the bias transistor 280, and the resistive element 282. It will be noted that in other embodiments, the configuration of the bias circuit 266 can vary to include more or fewer and/or different components than as described above. In general, the bias circuit 266 can include components that can collectively be capable of biasing the node 272 with a bias voltage, so that the bias voltage and the noise signal collectively enables the pull-down circuit 268.

As already discussed above, a conductive state of the switching circuit 204 is controlled by the driver circuit 208. For example, the state change (turning-off or turning-on) of the first switch 220 and the second switch 222, respectively, is controlled by the first driver circuit 236 and the second driver circuit 238, respectively. The first driver circuit 236 controls the conductive state of the first switch 220 based on a first driver output voltage 294 (for example, pdrvout), and the second driver circuit 238 controls the conductive state of the second switch 222 based on a second driver output voltage 296 (for example, ndrvout). For a state change of the first switch 220 and the second switch 222, or more specifically when the first switch 220 changes state from a conducting state to a non-conducting state and the second switch 222 changes state from the non-conducting state to the conducting state, due to the parasitic inductance present in the regulating circuit 200, the noise signal is generated at the node 246.

During the state change, the first switch 220 is in the conducting state, and the second switch 222 is in the non-conducting state. During the conducting state of the first switch 220 and the non-conducting state of the second switch 222, the first transistor 240 is in the off-state, the second transistor 242 is in the on-state, the third transistor 252 is in the off-state, and the fourth transistor 254 is in the on-state. Additionally, the current limiting switch 276 is in the on-state and the pull-down circuit 268 is in an on-state. Herein, 'the conducting state or the on-state of a switch' (the first switch 220, the second switch 222, or the current limiting switch 276) refers to a conducting state during which the switch (the first switch 220, the second switch 222, or the current limiting switch 276) conducts a predefined amount of current. Herein, 'the non-conducting state or the off-state of the switch' (the first switch 220, the second switch 222, or the current limiting switch 276) refers to a state during which the switch (the first switch 220, the second switch 222, or the current limiting switch 276) does not conduct a predefined amount of current (when accounting for a certain amount of electron drift that can inevitably occur even when the switch is in the non-conducting state).

In an embodiment, the control circuit 202 enables detection of the noise signal being generated during the state change of the first switch 220. In an example embodiment, the noise signal is detected by the coupling capacitor 264 of the the control circuit 202 (also referred to as a capacitive coupling path). The noise signal is indicative of a difference between the internal supply voltage and the external supply voltage associated with the switching circuit 204. The external supply voltage is supplied to the regulating circuit 200 and the internal supply voltage is generated in the regulating circuit 200 due to a presence of a parasitic inductance in the regulating circuit 200. In an example embodiment, based on a voltage difference between conductors of the coupling capacitor 264, the noise signal can be detected and coupled by the coupling capacitor 264. In other embodiments, the noise signal can be detected by an impedance coupling path.

On detection of the noise signal, the control circuit 202 is configured to control the driver circuit 208 to thereby slow down the state change of the first switch 220. The noise signal is received at the control circuit 202, for example, at the node 270 of the coupling capacitor 264. The coupling capacitor 264 further transmits the noise signal to the node 272. The current source 278 in the bias circuit 266 is configured to generate a constant current based on $V_{DD\_INT}$. The resistive element 282 is used in the bias circuit 266 in order to prevent any mismatch from occurring in the bias circuit 266. In some embodiments, the resistive element 282 is not present in the bias circuit 266. The bias transistor 280 is enabled to remain in an on-state and provide a bias voltage at the bias node 272, such that the bias voltage enables the pull-down circuit 268 on receiving the noise signal at the bias node 272.

The pull-down circuit 268 pulls current (a less amount of current) flowing in the first transistor 240 through the current limiting switch 276, when the first switch 220 is in the conducting state. However, upon receiving the noise signal during the state change of the first switch 220 (from the conducting state to the non-conducting state), the pull-down circuit 268 is enabled in response to the bias voltage to control the first driver output voltage 294 to thereby slow down the state change of the first switch 220. The pull-down circuit 268 on being biased with the bias voltage, pulls current (a high amount of current) flowing in the first transistor 240 such that an amount of current flowing through the second transistor 242 is reduced or pulled.

By reducing (or pulling) the current flowing through the second transistor 242, the pull-down circuit 268 prevents the first switch 220 to change state from the conducting state to the non-conducting state by controlling the first driver output voltage 294. Hence, the first driver output voltage 294 being generated is not sufficient to render the first switch 220 to the non-conducting state immediately, and a state change of the first switch 220 (a turning-off of the first switch 220) is thereby slowed down. Herein, the term 'turning-off of the first switch 220' refers to switching the first switch 220 to a non-conducting state. The noise signal (or the supply bounce and ground bounce) is hence reduced by slowing down the state change of the first switch 220 (by controlling the first driver output voltage 294).

Once the state change is complete, the first switch 220 assumes the non-conducting state, the second switch 222 assumes the conducting state, the first transistor 240 assumes the on-state, the second transistor 242 assumes the off-state, the third transistor 252 assumes the on-state, the fourth transistor 254 assumes the off-state, the current limiting switch 276 assumes the off-state, and the pull-down circuit 268 assumes the off-state. The current limiting switch 276 (the PMOS transistor) receives the second driver output voltage 296 at its gate terminal. Hence, during a state change of the second switch 222 and the first switch 220 (when the second switch 222 is changing state from the conducting state to the non-conducting state and when the first switch 220 is changing state from the non-conducting state to the conducting state), the current limiting switch 276 is in the off-state thereby preventing a shoot-through current flowing from the first transistor 240 to the pull-down circuit 268. Herein, the term 'shoot-through current' refers to a current that shoots through if two transistors (for example, the first transistor 240 and the pull-down circuit 268) are either enabled fully or partially to an on-state, simultaneously.

In an example embodiment, the shoot-through current can also flow through the first switch 220 and the second switch 222 if the first switch 220 and the second switch 222 are enabled to the conducting state simultaneously. In order to avoid such a situation, a dead-time is included between the non-conducting state of the first switch 220 and the conducting state of the second switch 222. Herein, the term 'dead-time' refers to a time delay that is provided between two switching states (for example, from the conducting state to the non-conducting state and from the non-conducting state to the conducting state).

Figure 3:
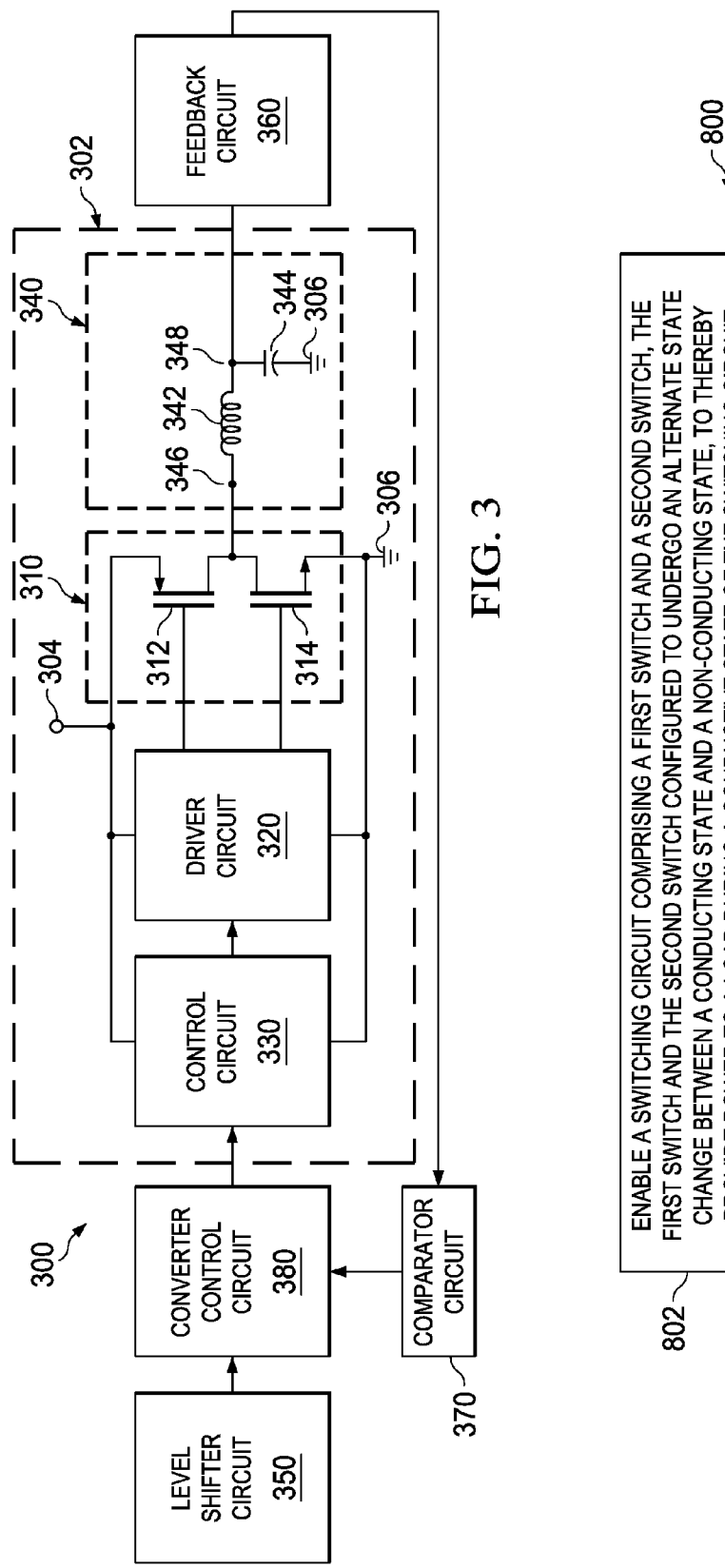
FIG. 3 is a block diagram of an example circuit implementing a circuit configured for driver control of a switching circuit in accordance with an example scenario.

FIG. 3 is a block diagram of an example circuit 300 implementing a circuit configured for driver control of a switching circuit, in accordance with an example embodiment. Examples of the circuit 300 can include, but are not limited to, a DC-DC converter, a class D amplifier, and the like. For example, the circuit 300 can be an example of a synchronous buck converter of a constant on-time (COT) architecture that is used in various applications to step down voltage and step up current. Some example applications of the synchronous buck converter are in central processing units, chipsets, peripheral devices, and the like.

In an example embodiment, the circuit for driver control of the switching circuit along with the switching circuit can be embodied in a regulating circuit in the circuit 300. For example, the circuit 300 includes a regulating circuit 302. In an example embodiment, the regulating circuit 302 is configured to regulate an output voltage of the circuit 300. The circuit 300 also includes a level shifter circuit 350, a feedback circuit 360, a comparator circuit 370, and a converter control circuit 380. The regulating circuit 302 is coupled between a supply terminal 304 and a ground terminal 306.

In an example embodiment, the regulating circuit 302 includes a switching circuit (for example, a switching circuit 310), a driver circuit (for example, a driver circuit 320) for driving the switching circuit 310, a circuit (for example, a control circuit 330) for driver control of the switching circuit 310, and a filter circuit 340. In an example embodiment, the switching circuit 310 is an example of the switching circuit 204 (refer FIG. 2), the driver circuit 320 is an example of the driver circuit 208 (refer FIG. 2), and the control circuit 330 is an example of the circuit 202 (refer FIG. 2). In an example embodiment, the output voltage of the circuit 300 can be regulated by operating the switching circuit 310. In an embodiment, the switching circuit 310 includes a high-side power MOSFET (for example, a first switch 312) and a low-side power MOSFET (for example, a second switch 314). Herein, the first switch 312 and the second switch 314 can be the examples of the first switch 220 and the second switch 222 (refer FIG. 2), respectively. In an embodiment, the filter circuit 340 includes an output inductor 342 and an output capacitor 344. Herein, the output inductor 342 and the output capacitor 344 can be the examples of the output inductor 226 and the output capacitor 228 (refer FIG. 2), respectively. The first switch 312 and the second switch 314 are configured to provide a path for an inductor current through the output inductor 342.

The filter circuit 340 is configured to filter noise that is manifested on the switching voltage (generated, for example, at a node 346) of the switching circuit 310 due to inherent switching in the switching circuit 310.

In an example embodiment, the circuits such as the level shifter circuit 350, the feedback circuit 360, the comparator circuit 370, and the converter control circuit 380 are shown and described to be configured outside the control circuit 330, and are shown as communicably coupled to the control circuit 330. In some embodiments, however, the level shifter circuit

350, the feedback circuit 360, the comparator circuit 370, and the converter control circuit 380 can be embodied inside the control circuit 330 for facilitating the circuit 300 to perform additional operations of the level shifter circuit 350, the feedback circuit 360, the comparator circuit 370, and the converter control circuit 380. Also, in the present embodiment, the converter control circuit 380 is assumed to be coupled to the control circuit 330 for controlling switching operation of the switching circuit 310. However, in alternate embodiments, the control circuit 330 for controlling the switching operation of the switching circuit 310 can be embodied within the converter control circuit 380. An operation of the circuit 300 is described below in detail.

In operation, the switching circuit 310 generates a switching voltage (at the node 346) based on an external voltage source. In an embodiment, the first switch 312 of the switching circuit 310 is driven by a first driver output voltage generated by a first driver of the driver circuit 320, and the second switch 314 is driven by a second driver output voltage generated by a second driver of the driver circuit 320. The switching circuit 310 generates a switching voltage (at the node 346). The filter circuit 340 filters the switching voltage, and generates an output voltage based on the switching voltage.

The level shifter circuit 350 receives signals from external circuitry which is at a low supply voltage (for example, at 1.1 volts (V)) and level shifts the low supply voltage to a higher supply voltage (for example, to 3.3V) for the converter control circuit 380. The control circuit 330, controlled by the converter control circuit 380, controls the switching circuit 310 in order to provide the output voltage which is a stepped down version of the higher supply voltage (for example, 3.3V is stepped down to 1.2V). The feedback circuit 360 receives a derivative voltage (generated, for example, at the node 348) of the output voltage from the filter circuit 340 and is configured to generate a feedback voltage. In an example embodiment, the derivative voltage is lesser than the output voltage. In an embodiment, the feedback circuit 360 is implemented using a resistor-divider circuit (due to programmability) and the feedback voltage that is generated is equivalent to a reference voltage (for example, 0.7V). In some embodiments, if the reference voltage is equivalent to the output voltage, the feedback circuit 360 is not present in the circuit 300. The feedback voltage from the feedback circuit 360 is provided to the comparator circuit 370.

In an embodiment, the comparator circuit 370 can include multiple comparators, for example a loop comparator, a minimum off-time comparator (COFF), a zero crossing comparator, and a current limiting comparator (ILIMIT), that can be configured to perform comparison for multiple signals in order to provide efficient switching of the first switch 312 and the second switch 314 in the switching circuit 310. The feedback voltage is compared with the reference voltage by the loop comparator to generate an ON pulse for the first switch 312. During a phase when the second switch 314 assumes the conducting state, the feedback voltage ramps down below the reference voltage due to a load and an output of the loop comparator goes high. The ON pulse is then generated to enable the first switch 312 to assume the conducting state. The first switch 312 can assume the conducting state for a fixed duration even if the loop comparator trips back.

Once the first switch 312 completes the duration of the conducting state, there is the dead-time or non-overlap time after which the second switch 314 is switched to the conducting state. Herein, the term 'dead-time' refers to a minimum time delay that is provided between two switching states (for example, from the conducting state to the non-conducting state and from the non-conducting state to the conducting state) such that efficiency of the switching circuit 310 is not reduced. The second switch 314 is now in the conducting state and presence of a blanking period generated by the COFF comparator is checked. Herein, the term 'blanking period' refers to a time during the non-conducting state of the first switch 312 or the conducting state of the second switch 314 during which signals from the converter control circuit 380 are not considered. The blanking period also provides information as to whether another ON pulse is required or not.

The COFF comparator determines the off time (for example, 50 nano seconds) of the first switch 312 by comparing the ramp signal with the reference voltage. The zero crossing comparator further ensures that when the inductor current reverses or goes below zero, the second switch 314 is required to be switched to the non-conducting state. The ILIMIT comparator is a current limiting comparator that generates a current limiting signal indicative of the inductor current exceeding a current limit or a rated current of the output inductor 342. The ILIMIT comparator further ensures that the first switch 312 is switched to the non-conducting state if the inductor current crosses the rated current of the output inductor 342.

The converter control circuit 380 receives signals from the multiple comparators in the comparator circuit 370, and performs different functions in the circuit 300. Examples of the functions of the converter control circuit 380 include, but are not limited to, non-overlap logic, power-up logic, test-mode logic, trimming logic, and enabling and disabling functions. In some embodiments, the control circuit 330 can be embodied, for example, in the converter control circuit 380 and the converter control circuit 380 operates similar to the control circuit 330 to thereby slow down the state change of the first switch 312 (for example from the conducting state to the non-conducting state). The control circuit 330 slows down the state change of the first switch 312 from the conducting state to the non-conducting state in order to reduce the noise signal and the output voltage can be regulated in the circuit 300 efficiently.

Figure 4:
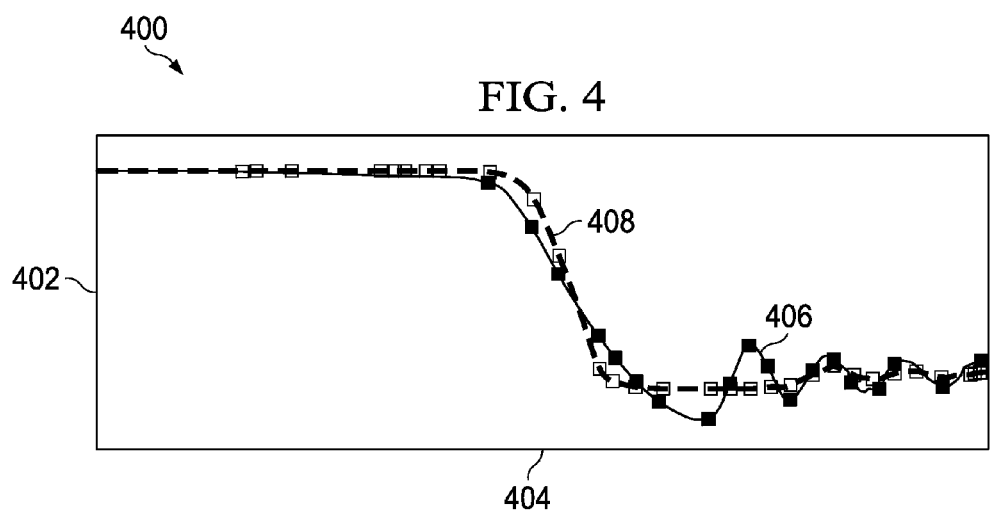
FIG. 4 is a graphical representation illustrating a variation of a switching voltage in a circuit with respect to time in accordance with an example embodiment.

FIG. 4 is a graphical representation illustrating variation of a switching voltage in a circuit for example, the switching circuit 204 (refer FIG. 2) with respect to time, in accordance with an example embodiment. In FIG. 4, a plot 400 representing variation of a switching voltage (plotted on Y-axis 402) against time (plotted on X-axis 404) is shown. The plot 400 shows that the switching voltage (for example, the switching voltage at the node 224 in FIG. 2 or the switching voltage at the node 346 in FIG. 3) in a circuit, for example the switching circuit 204 (refer FIG. 2), gradually decreases with time. The plot 400 is shown to depict two scenarios, for example a first scenario where a circuit (for example, the control circuit 202) for driver control of the switching circuit is not employed (as illustrated by a waveform 406), and a second scenario where a circuit (for example the control circuit 202) for driver control of the switching circuit is employed (as illustrated by a waveform 408).

In an example scenario, the time on X-axis 404 is depicted from 148.39000 micro seconds (μsec) to 148.455 μsec, and switching voltages on Y-axis 402 are depicted from −2.0 volts (V) to 4.0V. The waveform 406 corresponding to variation of the switching voltage with respect to the time being generated when no circuit for driver control of the switching circuit is utilized in a circuit shows abrupt changes in the switching voltage (for example, from 3.2V to −1.4V) from a high state to a low state with an increase in time (for example, from 148.39000 μsec to 148.433875 μsec).

In the scenario depicted by the waveform 408, where the circuit for driver control of the switching circuit is utilized in association with the switching circuit, for example the switching circuit 204 (refer FIG. 2), there is a gradual change in the switching voltage (for example, from 3.2V to −0.8V) from the high state to the low state, with the increase in the time (for example, from 148.39000 µsec to 148.430625 µsec). As illustrated in FIG. 4, the waveform 408 has a smooth variation in the switching voltage for the switching circuit (for example, the switching circuit 204) as compared to the waveform 406.

Figure 5:
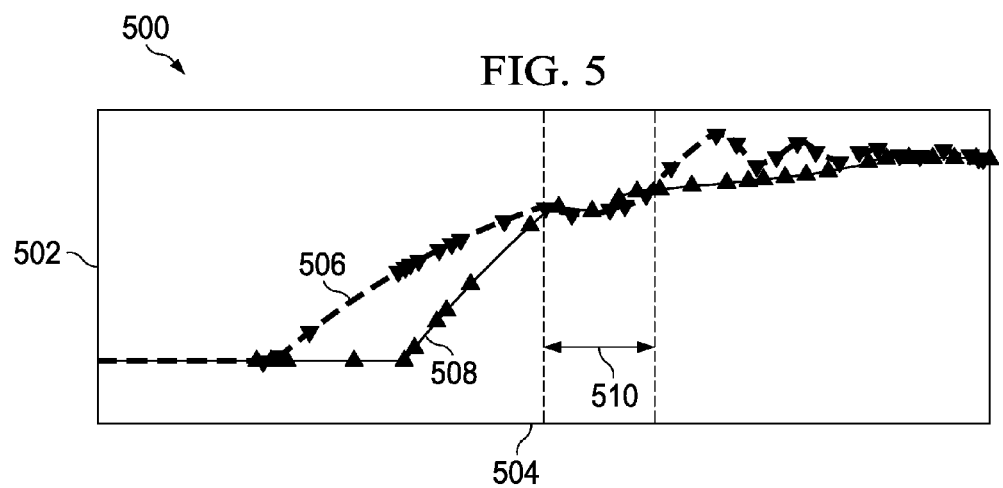
FIG. 5 is a graphical representation illustrating a variation of a first driver output voltage with respect to time in accordance with an example embodiment.

FIG. 5 is a graphical representation illustrating a variation of a first driver output voltage, for example, the first driver output voltage 294 (refer FIG. 2) with respect to time in a circuit, for example the regulating circuit 200 (refer FIG. 2), in accordance with an example embodiment. In FIG. 5, a plot 500 representing the variation of the first driver output voltage (plotted on Y-axis 502) against time (plotted on X-axis 504) is shown. The plot 500 is depicted corresponding to an example scenario where with increase in time, the first driver output voltage (for example, the first driver output voltage 294 in FIG. 2 or the first driver output voltage received by the first switch 312 in FIG. 3) gradually increases. In an example scenario, the time on X-axis 504 is plotted from 148.39000 µsec to 148.455 µsec, and first driver output voltages on Y-axis 502 are plotted from −1.0V to 4.0V. The plot 500 is shown to depict two scenarios, for example a first scenario where a circuit (for example, the control circuit 202) for driver control of the switching circuit is not employed (as illustrated by a waveform 506), and a second scenario where a circuit (for example, the control circuit 202) for driver control of the switching circuit is employed (as illustrated by a waveform 508).

In the scenario depicted by the waveform 506 on the plot 500, where no circuit for driver control of the switching circuit is employed, the first driver output voltage slowly changes (for example, from 0V to 2.6V) from a low-state to a high-state (a slow driver) with an increase in time (for example, from 148.40135 µsec to 148.42250 µsec). In another example scenario, depicted by the waveform 508, where the circuit 202 (refer FIG. 2) for driver control is employed in a regulating circuit 200 (refer FIG. 2), there is a fast change in the first driver output voltage 294 (refer FIG. 2) (a fast driver) from the low-state to the high-state (for example, from 0V to 2.6V), with time (for example, from 148.41275 µsec to 148.42250 µsec), as depicted in the waveform 508. However, during the transition of operation (shown as a transition portion 510), the first driver output voltage 294 (refer FIG. 2) slowly changes (for example, from 2.6V to 3.0V), with time (for example, from 148.42250 µsec to 148.30625 µsec) (the fast driver is slowed down only during the transition of operation).

As illustrated in FIG. 5, the waveform 508 has a smooth and gradual variation (after the transition portion 510) in the first driver output voltage 294 (refer FIG. 2) from the low-state to the high-state for the switching circuit 204 (refer FIG. 2) as compared with the waveform 506 (which depicts the ringing phenomenon as illustrated after the transition portion 510). Hence, by slowing down the driver only during the transition of operation (see, the transition portion 510), the waveform 508 has a smooth and gradual variation in the first driver output voltage 294.

Figure 6:
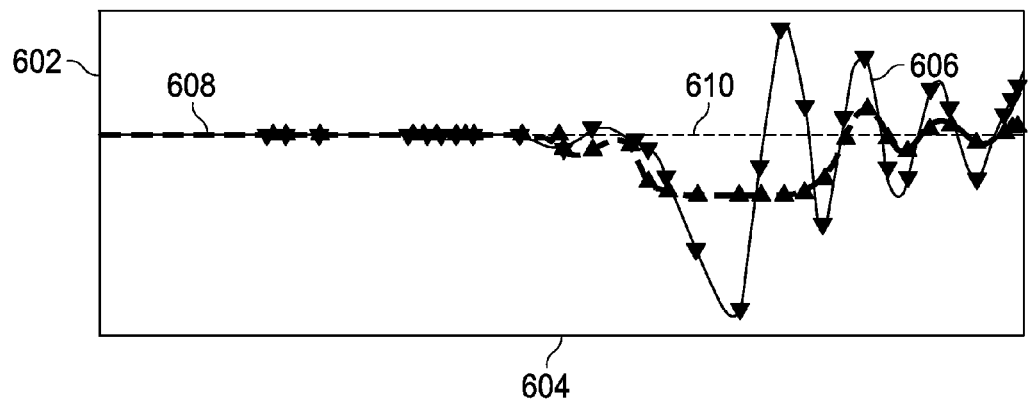
FIG. 6 is a graphical representation illustrating a variation of an internal negative supply voltage applied to a switching circuit with respect to time in accordance with an example embodiment.

FIG. 6 is a graphical representation illustrating variation of an internal negative supply voltage applied to a switching circuit, in a circuit, for example the regulating circuit 200 (refer FIG. 2) with respect to time, in accordance with an example embodiment. A voltage applied to the switching circuit can be a negative supply voltage ($V_{SS}$) at the negative rail of an external voltage source, for example, the external voltage source 212 (refer FIG. 2). As discussed with reference to FIG. 2, the voltage applied at the negative rail of the external voltage source can be at ground potential. Due to the presence of parasitic inductance in the circuit, the effective voltage or the internal negative supply voltage ($V_{SS\_INT}$) applied at the switching circuit is less or more (varies) than the negative supply voltage $V_{SS}$ (shown as a dotted line 610 in the FIG. 6).

In FIG. 6, a plot 600 between the internal negative supply voltage (plotted on Y-axis 602) against time (plotted on X-axis 604) is shown. The plot 600 is depicted corresponding to an example scenario where for an increase in the time the internal negative supply voltage gradually decreases or increases as compared to the negative supply voltage ($V_{SS}$) (at ground potential). In an example scenario, the range of time on X-axis 604 varies from 148.39000 µsec to 148.455 µsec, and the range of internal negative supply voltages on Y-axis 602 varies from −1.0V to 600 milli-volts (mV). The plot 600 is shown to depict two scenarios, for example a first scenario where no circuit for driver control of the switching circuit is employed (as illustrated by a waveform 606), and a second scenario where a circuit for driver control of the switching circuit is employed (as illustrated by a waveform 608).

In the scenario depicted by the waveform 606 on the plot 600, where no circuit for driver control of the switching circuit is employed, the waveform 606 depicts multiple bounces on the internal negative supply voltage. As illustrated by the waveform 606, the internal negative supply voltage abruptly varies (for example, from 0 mV to between −1.0V to 600 mV) with an increase in time (for example, from 148.4164875 µsec to 148.455 µsec). In another scenario depicted by the waveform 608, where a circuit for driver control of the switching circuit is employed, the waveform 608 depicts reduced bounces (both in number and magnitude) on the internal negative supply voltage. In an embodiment, on using the circuit (for example, the control circuit 202) for driver control of the switching circuit, there is a gradual change in the internal negative supply voltage (for example, from 0 mV to between −400 mV to 200 mV), with time (for example, from 148.4164 µsec to 148.455 µsec), as illustrated in FIG. 6. As illustrated in FIG. 6, the waveform 608 has a reduced bounce in the internal negative supply voltage as compared with the waveform 606.

Figure 7:
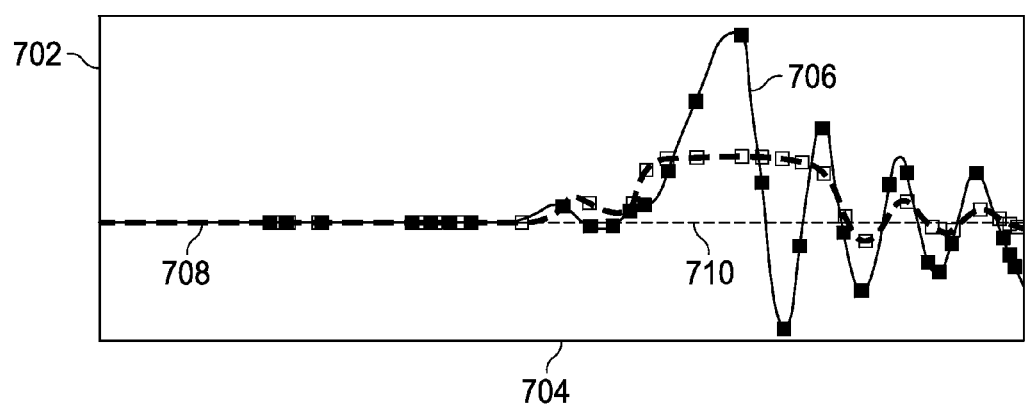
FIG. 7 is a graphical representation illustrating a variation of an internal positive supply voltage applied to a switching circuit with respect to time in accordance with an example embodiment.

FIG. 7 is a graphical representation illustrating variation of an internal positive supply voltage applied to a switching circuit, in a circuit, for example the regulating circuit 200 (refer FIG. 2) with respect to time, in accordance with an example embodiment. A voltage applied to the switching circuit can be a voltage ($V_{DD}$) at the positive rail of an external voltage source, for example, the external voltage source 212 (refer FIG. 2). As discussed with reference to FIG. 2, the voltage applied at the positive rail of the external voltage source can be at supply. Due to the presence of parasitic inductance in the circuit, the effective voltage or internal positive supply voltage ($V_{DD\_INT}$) applied at the switching circuit is greater than the positive supply voltage $V_{DD}$ (shown as a dotted line 710 in the FIG. 7).

In FIG. 7, a plot 700 between the internal positive supply voltage (plotted on Y-axis 702) against time (plotted on X-axis 704) is shown. The plot 700 is depicted corresponding to an example scenario where for an increase in the time the internal positive supply voltage gradually decreases or increases as compared to the external voltage source. In an example scenario, the range of time on X-axis 704 varies from 148.39000 µsec to 148.455 µsec and the range of internal positive supply voltages on Y-axis 702 varies from 2.70V to 4.30V. The plot 700 is shown to depict two scenarios, for example a first scenario where no circuit for driver control of the switching circuit is employed (as illustrated by a waveform 706), and a second scenario where a circuit for driver control of the switching circuit is employed (as illustrated by a waveform 708).

In the scenario depicted by the waveform 706 on the plot 700, where no circuit for driver control of the switching circuit is employed, the waveform 706 depicts multiple bounces in the internal positive supply voltage. As illustrated by the waveform 706, the internal positive supply voltage abruptly varies (for example, from 3.26V to between 2.70V to 4.30V) with an increase in time (for example, from 148.4164875 µsec to 148.455 µsec). In another scenario depicted by the waveform 708, where a circuit for driver control of the switching circuit is employed, the waveform 708 depicts reduced bounces (both in number and magnitude) in the internal positive supply voltage. In an embodiment, on using the circuit (for example, the control circuit 202) for driver control of the switching circuit, there is a gradual change in the internal positive supply voltage (for example, from 3.26V to between −3.10V to 3.66V), as depicted in the waveform 708, with the increase in the time (for example, from 148.4164875 µsec to 148.455 µsec), as illustrated in FIG. 7. As illustrated in FIG. 7, the waveform 708 has a reduced bounce in the internal positive supply voltage as compared with the waveform 706.

It will be noted that FIGS. 3-7 are provided for representation of example embodiments only, and should not be considered as limiting to the scope of the example embodiments. An example method of driver control for a switching circuit is explained further with reference to FIG. 8. It will be noted that for the description of the method in FIG. 8, various references will be made to the FIGS. 1-7 for explaining one or more embodiments of the method for driver control of a switching circuit.

Figure 8:
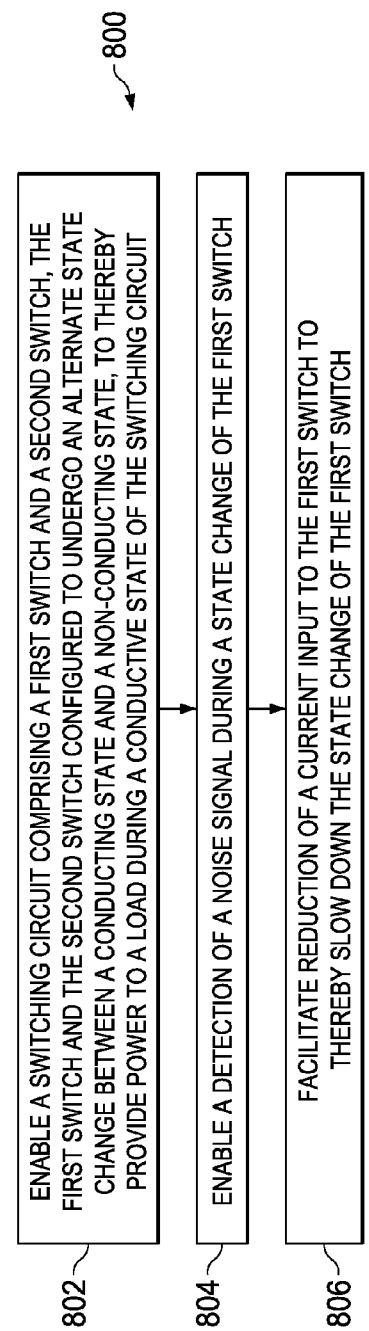
FIG. 8 illustrates a flowchart of an example method of driver control of a switching circuit in accordance with an example embodiment.

FIG. 8 is a flowchart of an example method 800 for driver control of a switching circuit being employed in a circuit, for example the regulating circuit 200 (as explained with reference to FIG. 2), in accordance with an example embodiment. In one example embodiment, the driver control is performed by a circuit (for example, the control circuit 202) for a switching circuit (for example, the switching circuit 204) in order to control switching in the switching circuit. In an embodiment, the controlling of the switching in the switching circuit facilitates in reducing a noise signal (or supply/ground bounce) in the circuit. The control circuit can be used in a plurality of applications and a plurality of electronic devices. Examples of the applications implementing the control circuit can include DC-DC converters and Class D amplifiers. Examples of the electronic devices can include microcontrollers, computers, mobile phones and other hand-held electronic devices, metering systems, timers, and alarm and monitoring circuits.

At block 802 of method 800, the switching circuit including a first switch (for example, the first switch 220 of FIG. 2) and a second switch (for example, the second switch 222 of FIG. 2) is enabled. The first switch and the second switch are configured to undergo an alternate state change between a conducting state and a non-conducting state, to thereby provide power to a load during a conductive state of the switching circuit. As discussed with reference to FIG. 2, the switching circuit is included within the regulating circuit along with a driver circuit (for example, the driver circuit 208), a control circuit (for example, the control circuit 202), and a filter circuit (for example, the filter circuit 210). The driver circuit is configured to control the conductive state of the switching circuit by facilitating state change of the first switch. The control circuit is configured to control the driver circuit to thereby slow down the state change. The filter circuit is configured to filter noise in a switching voltage of the switching circuit to generate an output voltage.

In some embodiments, the driver circuit includes a first driver circuit (for example, the first driver circuit 236) and a second driver circuit (for example, the second driver circuit 238). The first driver circuit controls the conducting state and the non-conducting state of the first switch, and the second driver circuit controls the conducting state and the non-conducting state of the second switch. The first driver circuit generates a first driver output voltage (for example the first driver output voltage 294) and the second driver circuit generates a second driver output voltage (for example the second driver output voltage 296), to drive the first switch and the second switch, respectively.

In some embodiments, the circuit, for example the regulating circuit 200, is selected by selecting at least the control circuit for controlling operation of the driver circuit. In an example embodiment, the control circuit is configured to control the state change of the switches, for example, the first switch of the switching circuit, to thereby slow down the state change. An example of the control circuit can be the control circuit 202 (refer FIG. 2). In an example embodiment, the control circuit includes a coupling capacitor (for example, the coupling capacitor 264), a bias circuit (for example, the bias circuit 266), and a pull-down circuit (for example, the pull-down circuit 268).

In an example embodiment, during the state change of the first switch, a noise signal can be generated due to the presence of parasitic inductances in the circuit. At block 804, detection of the noise signal during the state change of the first switch is enabled. The control circuit enables the detection of the noise signal. In an example embodiment, the coupling capacitor of the control circuit is configured to receive the noise signal at a node (for example, the node 270) during the state change of the first switch, and transmit the noise signal to a bias node (for example, to the bias node 272). The bias circuit is coupled to the coupling capacitor and the pull-down circuit at the bias node, and configured to bias the bias node at a bias voltage. The bias voltage and the noise signal collectively facilitates enabling of the pull-down circuit. The pull-down circuit is further coupled to the bias circuit at the bias node. The pull-down circuit is enabled in response to the bias voltage to facilitate a reduction of current input to the first switch and to thereby slow down the state change of the first switch.

At block 806, the reduction of the current input to the first switch is facilitated to thereby slow down the state change of the first switch. Based on the detection of the noise signal, the reduction of the current input to the first switch is facilitated by the control circuit. In an example embodiment, the current input to the first switch can be reduced by the implementation of the pull-down circuit, for example, the pull-down circuit 268 associated with the control circuit 202 (refer FIG. 2). In an example embodiment, the pull-down circuit can pull-down the current being supplied to the first driver circuit. In some embodiments, the node is biased at the bias voltage, and the pull-down circuit is enabled to sink at least a portion of the first driver output voltage. In an embodiment, pulling-down the current supplied to the first driver circuit (or the first driver output voltage) facilitates in reducing the current being supplied to the first switch, to thereby slow down the state change of the first switch. An example operation of the pull-down circuit is explained in detail with reference to FIG. 2.

In some embodiments, the control circuit further includes a current limiting switch (for example the current limiting switch 276) coupled between the pull-down circuit and the first driver circuit. The current limiting switch is selected when an off-state of the first switch is detected by the control circuit. The current limiting switch is further configured to be opened or enabled in order to prevent a shoot-through current from passing through the first driver circuit and the pull-down circuit during the non-conducting state of the first switch. In some embodiments, the current limiting switch is enabled during a conducting state of the first switch and disabled during the non-conducting state of the first switch.

Without in any way limiting the scope, interpretation, or application of the claims appearing below, advantages of one or more of the example embodiments disclosed herein include performing driver control in a circuit (by a control circuit) to enable reduction of supply bounce and ground bounce. Various circuits and methods have been provided that enables reduction of supply bounce and ground bounce by slowing down the state change of a first switch in the switching circuit. The slowing down of the state change of the first switch (by changing strength of the driver circuit) facilitates in maintaining efficiency of the circuit due to lower switching noise thereby leading the driver circuit to operate at a high speed. The supply bounce and the ground bounce are hence reduced which also decreases reliability concerns and noise coupling issues in the circuits. Also, as the control circuit as disclosed in the present disclosure is adaptive, it can be used in different types of packages with varying inductance values.

Although the present technology has been described with reference to specific example embodiments, it is noted that various modifications and changes can be made to these embodiments without departing from the broad spirit and scope of the present technology. For example, the various circuits, etc., described herein can be enabled and operated using hardware circuitry (for example, complementary metal oxide semiconductor (CMOS) based logic circuitry), firmware, software and/or any combination of hardware, firmware, and/or software (for example, embodied in a machine-readable medium). For example, the various electrical structures and methods can be embodied using transistors, logic gates, and electrical circuits (for example, application specific integrated circuit (ASIC) circuitry and/or in Digital Signal Processor (DSP) circuitry).

Also, techniques, devices, subsystems and methods described and illustrated in the various embodiments as discrete or separate can be combined or integrated with other systems, modules, techniques, or methods without departing from the scope of the present technology. Other items shown or discussed as directly coupled or communicating with each other can be coupled through some interface or device, such that the items can no longer be considered directly coupled to each other but can still be indirectly coupled and in communication, whether electrically, mechanically, or otherwise, with one another. Other examples of changes, substitutions, and alterations ascertainable by one skilled in the art, upon or subsequent to studying the example embodiments disclosed herein, can be made without departing from the spirit and scope of the present technology.

It is noted that the terminology "coupled to" does not necessarily indicate a direct physical relationship. For example, when two components are described as being "coupled to" one another, there can be one or more other devices, materials, etc., that are coupled between, attaching, integrating, etc., the two components. As such, the terminology "coupled to" shall be given its broadest possible meaning unless otherwise indicated.

It should be noted that reference throughout this specification to features, advantages, or similar language does not imply that all of the features and advantages should be or are in any single embodiment. Rather, language referring to the features and advantages can be understood to mean that a specific feature, advantage, or characteristic described in connection with an embodiment can be included in at least one embodiment of the present technology. Thus, discussions of the features and advantages, and similar language, throughout this specification can, but do not necessarily, refer to the same embodiment.

Various embodiments of the present disclosure, as discussed above, can be practiced with steps and/or operations in a different order, and/or with hardware elements in configurations which are different than those which are disclosed. Therefore, although the technology has been described based upon these example embodiments, it is noted that certain modifications, variations, and alternative constructions can be apparent and well within the spirit and scope of the technology. Although various example embodiments of the present technology are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. A circuit for driver control of a switching circuit, the circuit comprising:
    a driver circuit capable of being coupled to the switching circuit, the switching circuit comprising a first switch and a second switch, the driver circuit configured to control a conductive state of the switching circuit by facilitating an alternate state change of the first switch and the second switch; and
    a control circuit coupled to the driver circuit, the control circuit configured to detect a noise signal during a state change of the first switch, and the control circuit further configured to control the driver circuit to slow down the state change of the first switch;
    wherein the circuit and the switching circuit are configured to be coupled to an external voltage source, and wherein coupling the circuit and the switching circuit to the external voltage source facilitates in coupling the driver circuit, the control circuit and the switching circuit to a positive rail and a negative rail of the external voltage source;
    wherein the state change of the first switch comprises switching the first switch between a conducting state and a non-conducting state, and wherein the state change of the second switch comprises switching the second switch between a conducting state and a non-conducting state;
    wherein the control circuit is configured to reduce current input to the first switch on the detection of the noise signal, wherein a reduction of the current input to the first switch facilitates in slowing down the state change of the first switch from the conducting state to the non-conducting state.

2. The circuit of claim 1, wherein the control circuit comprises:
    a coupling capacitor configured to receive the noise signal during the state change of the first switch, the noise signal being indicative of a difference between an internal supply voltage and an external supply voltage associated with the switching circuit, the external supply voltage being supplied to the switching circuit by the external voltage source, and the internal supply voltage being generated in the switching circuit due to a presence of a parasitic inductance, the coupling capacitor further configured to transmit the noise signal to a bias node;
a pull-down circuit coupled to the bias node and the first driver circuit, the pull-down circuit being enabled in response to the noise signal being received at the bias node, wherein enabling of the pull-down circuit facilitates in slowing down the state change of the first switch; and
a bias circuit coupled to the coupling capacitor and the pull-down circuit at the bias node and configured to bias the bias node at a bias voltage, wherein the bias voltage and the noise signal collectively facilitates enabling of the pull-down circuit.

3. The circuit of claim 2, wherein the control circuit further comprises:
a current limiting switch coupled between the pull-down circuit and the first driver circuit, the current limiting switch being enabled during the conducting state of the first switch and disabled during the non-conducting state of the first switch, the current limiting switch configured to prevent a shoot-through current from flowing through the pull-down circuit during the state change of the second switch.

4. The circuit of claim 2, wherein the bias circuit is configured to be coupled between the positive rail and the negative rail of the external voltage source, the bias circuit comprises:
a current source configured to generate a constant current based on the internal supply voltage of the circuit;
a bias transistor comprising a drain terminal, a gate terminal and a source terminal, the drain terminal of the bias transistor being coupled to the current source, and the gate terminal of the bias transistor being coupled to the bias node through the drain terminal; and
a resistive element having a first terminal coupled to the source terminal of the bias transistor, and a second terminal coupled to the negative rail of the external voltage source.

5. The circuit of claim 4, wherein the first driver circuit comprises:
a first transistor configured to operate on the internal supply voltage being received at a source terminal of the first transistor; and
a second transistor configured to receive an input voltage of the first driver circuit, a drain terminal of the second transistor being coupled to a drain terminal of the first transistor, gate terminals of the first transistor and the second transistor coupled to each other, and a source terminal of the second transistor being coupled to the negative rail of the external voltage source.

6. The circuit of claim 4, wherein the second driver circuit comprises:
a third transistor configured to operate on the internal supply voltage being received at a source terminal of the third transistor; and
a fourth transistor configured to receive an input voltage of the second driver circuit, a drain terminal of the fourth transistor being coupled to a drain terminal of the third transistor, gate terminals of the third transistor and the fourth transistor coupled to each other, and a source terminal of the fourth transistor coupled to the negative rail of the external voltage source.

7. The circuit of claim 6, wherein each of the current limiting switch, the first switch, the first transistor, and the third transistor comprises a p-type metal oxide semiconductor (PMOS) transistor, and wherein each of the pull-down circuit, the second switch, the second transistor, the fourth transistor, and the bias transistor comprises an n-type metal oxide semiconductor (NMOS) transistor.

8. A regulating circuit comprising:
a switching circuit comprising a first switch and a second switch, the first switch and the second switch configured to undergo an alternate state change to thereby provide power to a load during a conductive state of the switching circuit;
a driver circuit coupled to the switching circuit, the driver circuit comprising a first driver circuit and a second driver circuit configured to facilitate the alternate state change of the first switch and the second switch, respectively, to thereby control the conductive state of the switching circuit; and
a control circuit coupled to the driver circuit, the control circuit configured to detect a noise signal during a state change of the first switch, and the control circuit further configured to control the driver circuit to thereby slow down the state change of the first switch;
wherein the regulating circuit is configured to be coupled to an external voltage source, and wherein coupling the regulating circuit to the external voltage source facilitates in coupling the switching circuit, the driver circuit and the control circuit to a positive rail and a negative rail of the external voltage source;
wherein the state change of the first switch comprises switching the first switch between a conducting state and a non-conducting state, and wherein the state change of the second switch comprises switching the second switch between a conducting state and a non-conducting state;
wherein the control circuit is configured to reduce current input to the first switch on the detection of the noise signal, wherein a reduction of the current input to the first switch facilitates in slowing down the state change of the first switch from the conducting state to the non-conducting state.

9. The regulating circuit of claim 8, wherein the control circuit comprises:
a coupling capacitor configured to receive the noise signal during the state change of the first switch, the noise signal being indicative of a difference between an internal supply voltage and an external supply voltage associated with the switching circuit, the external supply voltage being supplied to the regulating circuit by an external voltage source, and an internal supply voltage being generated in the regulating circuit due to a presence of a parasitic inductance in the regulating circuit, the coupling capacitor further configured to transmit the noise signal to a bias node;
a pull-down circuit coupled to the bias node and the first driver circuit, the pull-down circuit being enabled in response to the noise signal being received at the bias node, wherein enabling of the pull-down circuit facilitates in slowing down the state change of the first switch; and
a bias circuit coupled to the coupling capacitor and the pull-down circuit at the bias node and configured to bias the bias node at a bias voltage, wherein the bias voltage and the noise signal collectively facilitates enabling of the pull-down circuit.

10. The regulating circuit of claim 9, wherein the control circuit further comprises:
a current limiting switch coupled between the pull-down circuit and the first driver circuit, the current limiting switch being enabled during the conducting state of the first switch and disabled during the non-conducting state of the first switch, the current limiting switch configured to prevent flow of a shoot-through current through the pull-down circuit during the state change of the second switch.

11. A method of driver control of a switching circuit, the method comprising:

enabling the switching circuit comprising a first switch and a second switch, the first switch and the second switch configured to undergo an alternate state change between a conducting state and a non-conducting state, to thereby provide power to a load during a conductive state of the switching circuit;

enabling a detection of a noise signal during a state change of the first switch; and facilitating reduction of a current input to the first switch to thereby slow down the state change of the first switch;

controlling the conducting state and the non-conducting state of the first switch by a first driver circuit coupled to the first switch, and controlling the conducting state and the non-conducting state of the second switch by a second driver circuit coupled to the second switch;

receiving the noise signal during the state change of the first switch;

transmitting the noise signal to a bias node being biased at a bias voltage; and facilitating, in response to the transmittal of the noise signal to the bias node, pulling down the current input to the first switch to thereby slow down the state change of the first switch.

12. The method as claimed in claim 11, further comprising preventing a shoot-through current from flowing through the first driver circuit during the non-conducting state of the first switch.

* * * * *